US008435726B2

(12) United States Patent
Pazidis et al.

(10) Patent No.: US 8,435,726 B2
(45) Date of Patent: May 7, 2013

(54) METHOD OF PROCESSING AN OPTICAL ELEMENT AND AN OPTICAL ELEMENT, IN PARTICULAR FOR A MICROLITHOGRAPHIC PROJECTION EXPOSURE APPARATUS

(75) Inventors: Alexandra Pazidis, Aalen (DE);
Christoph Zaczek, Heubach (DE);
Alexander Hirnet, Oberkochen (DE);
Herbert Fink, Mannheim (DE); Dieter Schmerek, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1336 days.

(21) Appl. No.: 12/135,781

(22) Filed: Jun. 9, 2008

(65) Prior Publication Data

US 2008/0309905 A1 Dec. 18, 2008

Related U.S. Application Data

(63) Continuation of application No. PCT/EP2006/068319, filed on Nov. 9, 2006.

(60) Provisional application No. 60/748,750, filed on Dec. 9, 2005.

(51) Int. Cl.
*G02B 3/00* (2006.01)

(52) U.S. Cl.
USPC .............. 430/322; 355/67; 264/1.1; 427/162

(58) Field of Classification Search ........................ None
See application file for complete search history.

(56) References Cited

U.S. PATENT DOCUMENTS

| 5,686,206 | A | 11/1997 | Baum et al. |
| 6,783,704 | B1 | 8/2004 | Anthes et al. |
| 2004/0009408 | A1* | 1/2004 | Fisch et al. ........................ 430/5 |
| 2004/0157134 | A1* | 8/2004 | Kim et al. ......................... 430/5 |
| 2005/0225737 | A1 | 10/2005 | Weissenrieder et al. |
| 2006/0001801 | A1* | 1/2006 | Kim et al. ..................... 349/106 |
| 2006/0007433 | A1* | 1/2006 | Ikuta et al. ................. 356/237.2 |
| 2006/0046065 | A1* | 3/2006 | Suzuki et al. ................. 428/412 |

FOREIGN PATENT DOCUMENTS

| DE | 10 2004 059 778 A1 | 8/2005 |
| JP | 62 083749 A | 4/1987 |
| JP | 62083749 A | 4/1987 |
| JP | 08164517 | 6/1996 |
| JP | 8-257780 A * | 10/1996 |
| JP | 11264903 | 9/1999 |
| JP | 2002014202 | 1/2002 |

(Continued)

OTHER PUBLICATIONS

Computer-generated translation of JP 8-257780 A (Oct. 1996).*

(Continued)

*Primary Examiner* — John A. McPherson
(74) *Attorney, Agent, or Firm* — Sughrue Mion, PLLC

(57) ABSTRACT

A method of processing an optical element which has a substrate (110) and a layer system (120) applied to the substrate (110), wherein the layer system (120) in a starting condition has a plurality of volume defects (130), wherein the method includes at least partially filling at least one of the volume defects (130) with a filling material (140). Also disclosed is an associated method of manufacturing an optical element.

29 Claims, 4 Drawing Sheets

FOREIGN PATENT DOCUMENTS

| | | | |
|---|---|---|---|
| JP | 2002022903 | | 1/2002 |
| JP | 2002-214759 A | * | 7/2002 |
| WO | 00/69785 | | 11/2000 |
| WO | 03/003119 A1 | | 1/2003 |

OTHER PUBLICATIONS

Computer-generated translation of JP 2002-214759 (Jul. 2002).*

* cited by examiner a)

b)

METHOD OF PROCESSING AN OPTICAL ELEMENT AND AN OPTICAL ELEMENT, IN PARTICULAR FOR A MICROLITHOGRAPHIC PROJECTION EXPOSURE APPARATUS

This is a Continuation of International Application PCT/EP2006/068319, with an international filing date of Nov. 9, 2006, which was published under PCT Article 21(2) in German, and the disclosure of which is incorporated into this application by reference. This application claims priority and benefit of U.S. provisional patent application 60/748,750, filed Dec. 9, 2005. The disclosure of this application is also incorporated herein in its entirety.

BACKGROUND OF THE INVENTION

1. Field of the Invention

The invention concerns a method of processing an optical element and an optical element, in particular for a microlithographic projection exposure apparatus.

2. State of the Art

Microlithography is used for the production of microstructured components such as for example integrated circuits or LCDs. The microlithography process is carried out in what is known as a projection exposure apparatus having an illumination system and a projection objective. The image of a mask (=reticle) illuminated by means of the illumination system is projected by means of the projection objective onto a substrate (for example a silicon wafer) which is coated with a light-sensitive layer (for example photoresist) and arranged in the image plane of the projection objective in order to transfer the mask structure onto the light-sensitive coating on the substrate.

Both in the illumination system and also in the projection objective, layers or layer systems are frequently used on the optical elements, for example to achieve desired optical effects (for example as anti-reflection layers) or as protection for optical elements such as for example lenses against degradation.

It is known inter alia from DE 10 2004 059 778 A1 and US 2005/0225737 A1, in a projection objective for immersion lithography, to provide the last optical element with a protective layer system provided for contact with the immersion medium in order to increase the resistance to degradation caused by the immersion medium. The protective layer system can also include in particular a barrier layer which is substantially impermeable to the immersion medium. The disclosure of those applications is hereby incorporated to the full extent thereof by reference ("incorporation by reference").

It is known inter alia from JP 2002022903 A to apply a water-repellent layer, for example by vapor deposition of alkoxy polymer, on a layer system applied to a lens, having an outermost $SiO_2$ layer. It is known inter alia from JP 08164517 A for a photoelectric diode provided in a silicon substrate to be protected from washing water (used when sawing up the wafer for cleaning purposes) with a water-repellent layer. It is known inter alia from JP 11264903 A for an outer $SiO_2$ layer to be applied to an anti-reflection layer used especially in the UV range. It is known inter alia from JP 2002014202 A for an outer layer consisting of an oxide to be formed in a layer system applied to a substrate and having a fluoride-bearing layer.

It is known inter alia from WO 00/69785 for a hydrophobic layer to be produced by thermal vapor deposition with polyfluorocarbons in a high vacuum on optical substrates which have an alkaline earth metal or alkali metal fluoride layer as the outermost layer or which comprise alkaline earth metal or alkali metal fluorides.

The problem which frequently occurs in the above-mentioned layer system (that is to say also in any protective layers which are present) is that those layer systems have pores or layer defects for example in the form of holes, cracks or "pinholes". Defects of that kind can have an adverse effect in many respects on the imaging quality of the system and the service life of optical components of the system.

Impairment of the imaging quality can result on the one hand from the effect of form birefringence which occurs as a consequence of the presence of pores: the term "form birefringence" is used here to denote the presence of two different refractive indices by virtue of a layer structure which is present in a grown layer system when that layer structure comprises a large number of columns containing the layer material and pores therebetween. On the other hand impairment of the imaging quality can also result from filling or emptying of the pores, for example with water or hydrocarbons, which occurs repeatedly and in an undefined fashion during operation of the projection exposure apparatus.

A reduction in the length of the service life of optical components of system can result from the fact that fluorine-bearing organic substances which outgas from the photoresist are converted into gaseous hydrogen fluoride (HF) at the wavelengths used in the UV range, such as for example 193 nm, and penetrate through the pores or defects in a layer to the respective substrate behind the layer (for example the $SiO_2$ lens) and can chemically attack it and thereby damage it. In addition, degradation for example of the last optical element, caused by an immersion medium (for example deionized water) can also occur if the immersion medium for example penetrates through layer non-homogeneities or pinholes in a protective layer and reaches the last optical element and damages it by physical processes (dissolution) or chemical processes (etching thereon).

SUMMARY OF THE INVENTION

One object is to provide a method of processing an optical element, by means of which impairment of the optical properties due to volume defects present in a layer system of the optical element such as pores, layer non-homogeneities or the like can be reduced or avoided.

A method of processing an optical element which has a substrate and a layer system applied to said substrate, wherein the layer system in a starting condition has a plurality of volume defects is provided, includes: at least partially filling at least one of the volume defects with a filling material.

In the context of the present application, the term "layer system" is deemed to embrace both single layers and also multiple layer arrangements (for example interference layer systems like anti-reflection layers).

In the context of the present application the term "volume defect" is used to denote all kinds of intermediate spaces occurring in a layer, for example pores, holes, cracks, pinholes or other layer non-homogeneities.

Volume defects present in a layer system of the optical element in the starting condition are not only merely sealed off outwardly but at least partially filled up by means of a suitable filling material, that is to say that filling material is embedded in the volume defects themselves so that enhanced compactness or reduced porosity of the layer material is achieved.

Preferably, at least one volume defect is filled to a substantial part thereof with filling material, that is to say a degree of filling of said volume defect which is defined as the relationship of the volume filled with the filling material to the total defect volume is preferably at least 30%, preferably at least 60%, still more preferably at least 90%.

In a further preferred feature, that volume defect is completely filled with filling material (that is to say the degree of filling of that volume defect is one).

Preferably the method provided substantially reduces overall the porosity of the layer system of the processed optical element. In particular preferably at least 30% of the defect volume present within the layer system, more preferably at least 60% and still more preferably at least 90% of the total defect volume present within the layer system is filled with filling material.

As a consequence of at least partial filling in accordance with the invention of at least one of the volume defects with a filling material, on the one hand this produces a defined condition for the respective layer system, whose condition thereafter (for example in operation of the optical system including the optical element, in particular a projection exposure apparatus, under the action of electromagnetic radiation) changes less or indeed not at all as repeated filling/emptying of the volume defects which occurs otherwise (with unfilled volume defects) in operation of the optical system and/or diffusion through the system of substrate-damaging substances is reduced or (in the case of completely filled volume defects) entirely prevented. Furthermore, with the filling of volume defects or pores in a layer system involving a columnar structure, the effect of form birefringence can also be at least partially compensated.

In a use the at least one volume defect can involve a relatively large intermediate space present in the layer system, with a mean diameter of more than 50 nm, typically in the range of between 1 and 500 μm. In a further use the at least one volume defect is a pore involving a typical pore diameter in the range of between 5 nm and 50 nm. Pores of that kind are typically produced in large numbers when layer systems are applied (grown) so that such layer structures comprise a large number of columns containing the layer material and pores therebetween. In such layer structures the pores present, in an inclined arrangement (for example in an optically anisotropic layer system) result in the effect already mentioned above of form birefringence. For quantitatively describing form birefringence, in a simplification, it is possible to specify a refractive index which applies in the direction of growth of the columns and a refractive index perpendicular thereto.

A refractive index contrast which is less (in comparison with air-filled pores) and thus a reduction in the retardation produced by form birefringence (that is used to denote the difference in the optical paths of two polarization states which are orthogonal, that is to say in mutually perpendicular relationship) can be achieved by way of the at least partial filling of the pores between the columns with a suitable filling material.

In an embodiment the filling material is silicon dioxide ($SiO_2$).

In a further embodiment the filling material is an organic material, preferably a fluorine-bearing organic material, further preferably an amorphous perfluoro polymer (for example Teflon-AF® or Cytop®) or a perfluoro-N-alkane. Such an organic material can be introduced directly into the volume defects to be filled, for example by means of PVD or spin coating.

In an embodiment the filling material can be formed in particular by conversion of a starting material during the action of electromagnetic radiation.

That electromagnetic radiation is preferably of a wavelength of less than 370 nm, preferably less than 250 nm and still more preferably less than 200 nm.

In an embodiment that starting material can be gaseous. The starting material can be a substituted silane, preferably fluorotrimethylsilane, hexamethyidisilazane, trimethylsilanol or hexamethylcyclotrisiloxane.

For the use for example of hexamethyidisilazane (HMDS) conversion into $SiO_2$ is effected in a moist, oxygen-bearing environment under the action of UV radiation, in accordance with the following reaction equation:

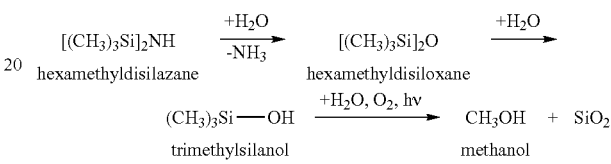

In that reaction therefore gaseous methanol and solid (quartz-like) silicon dioxide ($SiO_2$) are produced, wherein the $SiO_2$ formed serves as a filling material for filling the volume defects (for example pores). It was possible to establish on the basis of tests in particular that that $SiO_2$ is of high optical quality, in which respect a degree of absorption below the measuring accuracy of 0.50% was ascertained for example for an $SiO_2$ layer deposited in a layer thickness of 160 nm.

Preferably the filling operation according to the invention is effected in controlled fashion (for example by a suitable starting material being fed in a suitable defined fashion and/or the temperature being controllably set).

In a further embodiment water is used as the filling material. That water can be supplied at least partially in gaseous form with a flushing gas used for flushing the optical system (for example a projection exposure apparatus).

In an embodiment the water is supplied in such a way that a water content is set in the atmosphere surrounding the layer system, of greater than $10^{-5}$%, that is to say greater than the moisture content typically present in operation of a projection objective. Preferably for the incorporation of water as the filling material the water content in the atmosphere surrounding the layer system should be set to be greater than 1%, preferably greater than 10%, still more preferably greater than 40%.

The invention can advantageously be used for microlithographic applications but is not restricted thereto but in principle can be employed for the treatment of layers in all regions of application.

When used for processing a layer system for an optical system of a microlithographic projection exposure apparatus the at least partial filling of volume defects, in accordance with the invention, can also be effected directly in operation of the projection exposure apparatus, that is to say for example directly by the customer. In accordance with the invention it is possible in that way to also fill or repair in particular volume defects which have occurred due to for example operationally induced degradation of a layer system (for example an anti-reflection layer, a protective layer and so forth).

The invention further concerns a method of manufacturing an optical element, including:
applying a layer system to a substrate, wherein the layer system after application has a plurality of volume defects; and
at least partially filling at least one of the volume defects with a filling material.

In relation to preferred configurations of that method reference is directed to the configurations described in relation to the method of processing an optical element and the preferred configurations set forth in the appendant claims.

The invention further concerns an optical element which has been processed or manufactured by means of a method according to the invention, a microlithographic projection exposure apparatus having at least one such element, a method of microlithographic manufacture of microstructured components and a microstructured component.

Further configurations of the invention are to be found in the description hereinafter and the appendant claims.

The invention is described in greater detail hereinafter by means of embodiments by way of example and with reference to the accompanying drawings.

DETAILED DESCRIPTION OF PREFERRED EMBODIMENTS

Figure 1:
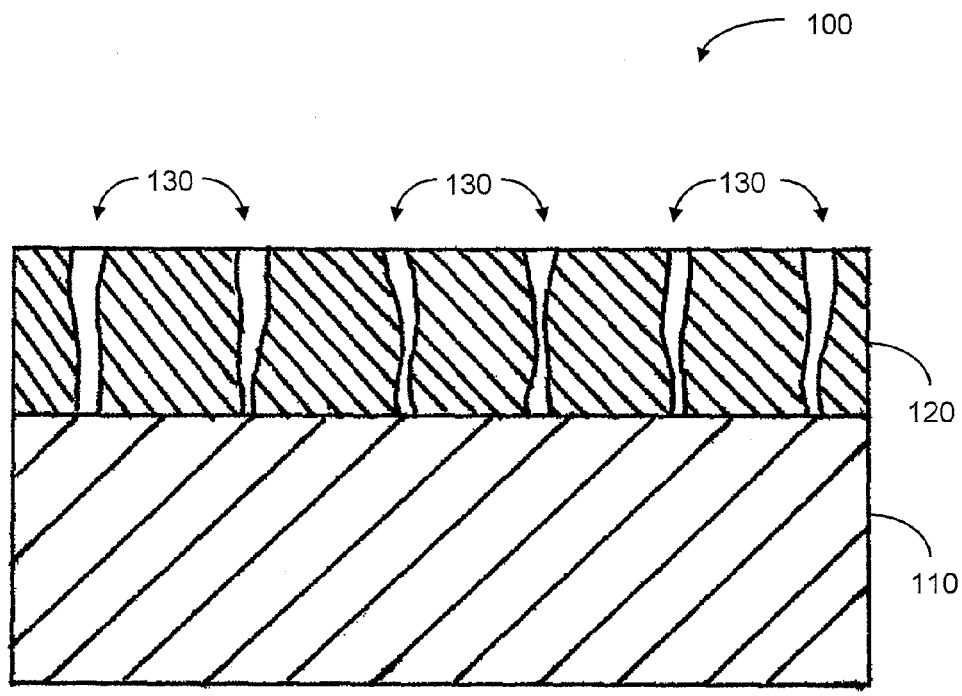
FIG. 1 shows a diagrammatic view of a layer system before (FIG. 1a) and after filling of volume defects (FIG. 1b) to describe in principle a method according to the invention.
Figure 1:
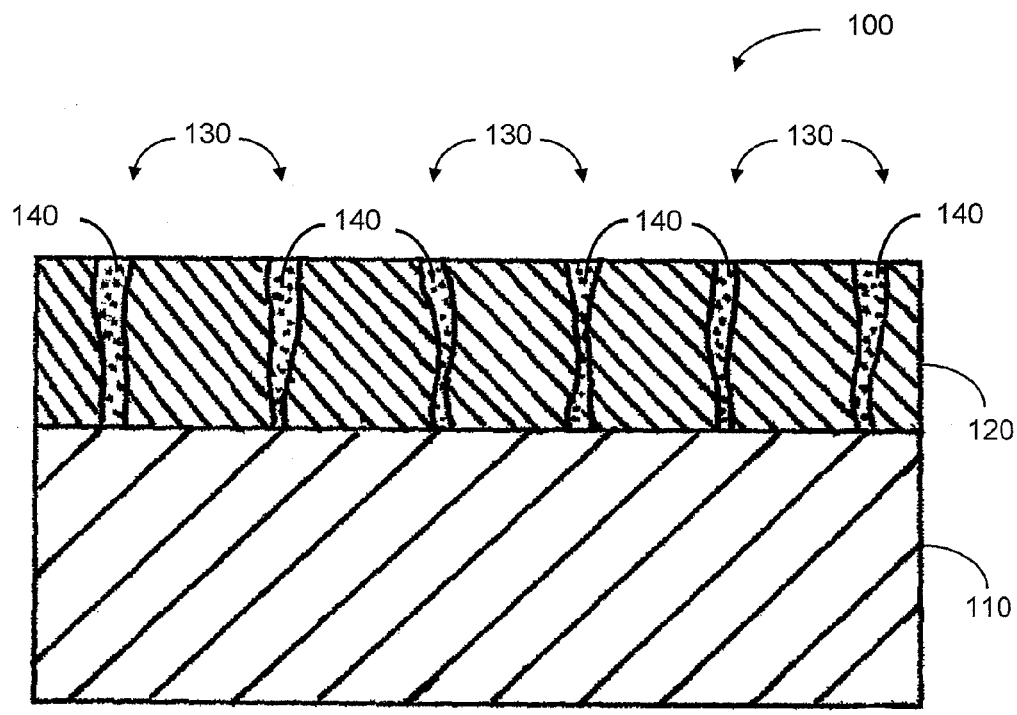

FIG. 1 is an only diagrammatic view which is not to scale showing the structure of an optical element 100 which is to be processed in accordance with the method, with a layer 120 applied to a substrate 110. In accordance with a preferred application of the method this involves an optical element 100 of a microlithographic projection exposure apparatus, the structure of which in principle will be described hereinafter. The substrate 110 can be for example a lens which is sufficiently transmissive for light of the working wavelength which, depending on the respective laser light source used, for example when using a KrF excimer laser 248 nm, when using an ArF excimer laser 193 nm or when using an $F_2$ laser 157 nm, for example a fluoride lens for example of calcium fluoride ($CaF_2$) or a quartz lens of quartz ($SiO_2$), to which the layer 120 is applied for example as a protective layer or an anti-reflection layer.

In its starting condition as indicated in FIG. 1a that layer 120 has a plurality of volume defects 130. In the view which is only by way of example those volume defects 130 are shown in the form of pores, in which respect the typical pore diameter thereof can be in the range of between 5 nm and 50 nm and in which case the layer material of the layer 120 is typically in the form of columns between those individual pores.

FIG. 1b diagrammatically shows the condition after application of the method, with the volume defects 130 here being filled with a filling material 140.

To carry out the method, in accordance with a first embodiment, the optical element 100 in the form of a calcium fluoride lens coated with an $SiO_2$ protective layer is arranged in a chamber, which chamber can be filled for example with ambient air. Thereupon gaseous hexamethyldisilazane (HMDS) can be caused to diffuse into the chamber or it is supplied in a suitable defined concentration by a gas flow. The temperature of the chamber can be for example ambient temperature or can be set in a controlled fashion to enhance the mobility of the gas molecules. The regions in which volume defects are to be filled in accordance with the invention are then irradiated with UV light. That UV irradiation operation can be implemented both in positionally resolved relationship with a laser beam (to illuminate individual defects in the range of magnitude of between several μm and mm) and also over the entire surface area (to illuminate a pore structure with pore sizes in the nm range), in which case an expanded laser beam or a UV lamp (for example a medium pressure mercury vapor lamp) can serve for carrying out irradiation over the entire surface area. The starting material introduced in gas form (in the example hexamethyidisilazane) diffuses into the pores and is there converted under the action of UV radiation in accordance with the reaction:

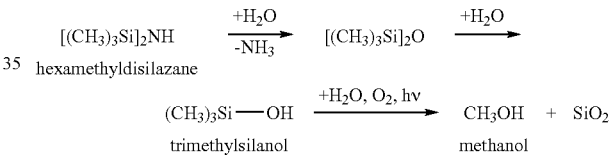

into $SiO_2$ which fills up the volume defects to achieve the condition diagrammatically shown in FIG. 1b.

In accordance with a second embodiment a suitable liquid starting material, for example polydimethylsiloxane, can be applied to the layer structure 120 to fill the volume defects by means of spin coating or by being brushed on, and is then irradiated with UV light in positionally resolved fashion or over the entire surface area for conversion into solid quartz-like $SiO_2$, in which case the conversion takes place in accordance with the reaction:

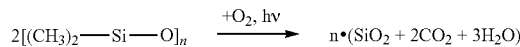

In accordance with a third embodiment a projection objective which has an optical element 100 according to the invention in the form of a lens provided with an anti-reflection layer or a protective layer and which is usually flushed with a dry flushing gas (for example nitrogen or a nitrogen mixture) is flushed with "moist" air (that is to say air containing water in gas form), wherein the water content in the atmosphere surrounding the layer system 120 is adjusted for example to be greater than 10% so that the water contained in that atmosphere penetrates into the volume defects as a consequence of adsorption and the capillary effect, to achieve the condition indicated in FIG. 1b.

Figure 2:
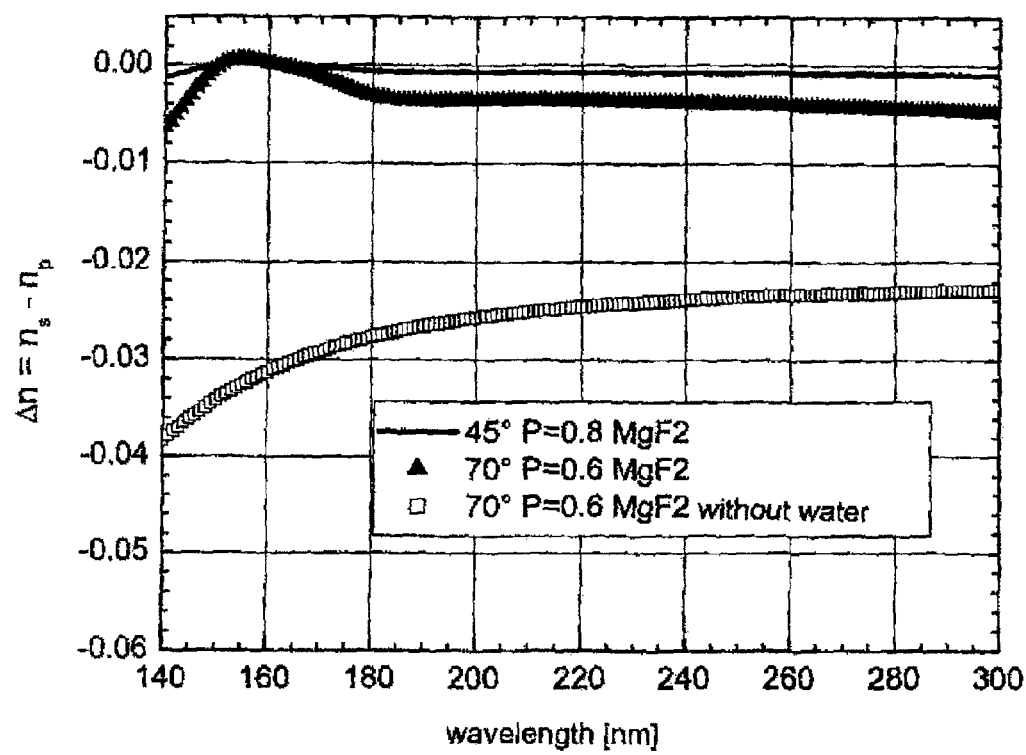
FIG. 2 shows the result of a simulation for calculation of the dependency of birefringence on the wavelength of the electromagnetic radiation prior to application of the method and after application of the method in accordance with an embodiment, the latter for two different packing densities.

FIG. 2 shows the result of a simulation of the influence of water as a filling material in pores within a layer of magnesium fluoride ($MgF_2$). In that case, the dependency of birefringence (specified in $\Delta n = n_s - n_p$, wherein $n_s$ and $n_p$ denote the refractive indices for the s- and the p-component of the electrical field strength vector) on wavelength is respectively plotted, more specifically both for the water-free layer and also for a degree of water filling of the pores of 30%, the latter both for a packing density of 0.8 at a vapor deposition angle of 45° and also for a packing density of 0.6 at a vapor deposition angle of 70°. In the case of the single $MgF_2$ layer considered in the present case the birefringence occurring is markedly reduced by filling the pores with water, as can be seen from FIG. 2.

In accordance with a further aspect the operation of filling volume defects of an optical element of a projection exposure apparatus, in accordance with the invention, can be effected directly in operation of that projection exposure apparatus, that is to say directly by the customer.

That can be effected for example if, after a prolonged period of use, individual defects have been formed in an $SiO_2$ protective layer on a calcium fluoride lens of the projection exposure apparatus. The calcium fluoride lens can be for example the last lens at the image side of an immersion objective, in which the $SiO_2$ protective layer is applied to the side of the lens that is towards the immersion medium (for example deionized water). In that example, for application of the invention for example in a fourth embodiment, a suitable starting material (for example hexamethyldisilazane) which is converted into a desired filling material (for example $SiO_2$) under the action of electromagnetic radiation at the working wavelength can be introduced in a gaseous state by way of a gas feed provided for that purpose into the region of that $SiO_2$ protective layer, whereupon, with subsequent irradiation with the UV laser light of the illumination system (at a wavelength of for example 193 nm) the hexamethyldisilazane is converted into $SiO_2$ in accordance with the above-specified reaction equation.

Figure 3:
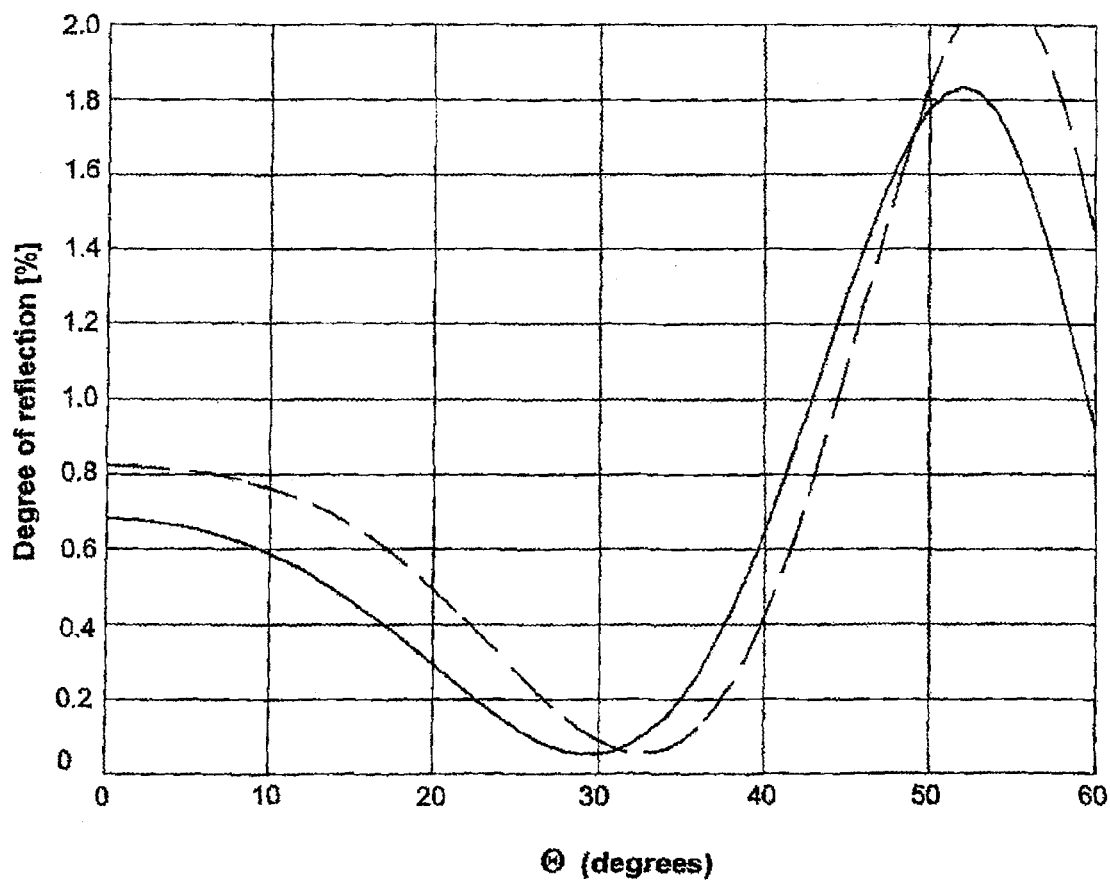
FIG. 3 shows for a layer processed in accordance with the method a measured dependency of the degree of reflection on the angle of incidence of the electromagnetic radiation before (solid line) and after (broken line) application of the method in a further embodiment.

As can be seen from the measured dependency, shown in FIG. 3, of the degree of reflection on the angle of incidence of the electromagnetic radiation prior to and after application of the method according to the invention respectively, there is only a slight change in the reflectivity as a consequence of the $SiO_2$ layer additionally applied by the method, as a consequence of the immersion medium adjoining that $SiO_2$ layer and the low difference in refractive index resulting therefrom. It can therefore be seen that the use of the method of processing a layer system adjoining an immersion medium is advantageous insofar as, as a consequence of an additional $SiO_2$ layer which is possibly applied in the filling of volume defects in accordance with the invention, because of the adjoining immersion medium, it leads only to a slight optical effect or negligible mismatching of the overall system.

In accordance with a fifth embodiment a suitable starting material which can be converted into the desired filling material under the action of electromagnetic radiation at the working wavelength, in the liquid condition (for example polydimethylsiloxane) or in the solid condition (for example silicone pastes, that is to say highly cross-linked polysiloxane polymers) can be arranged instead of the wafer in the wafer plane of the projection objective and then irradiated with the laser light of the illumination device.

Figure 4:
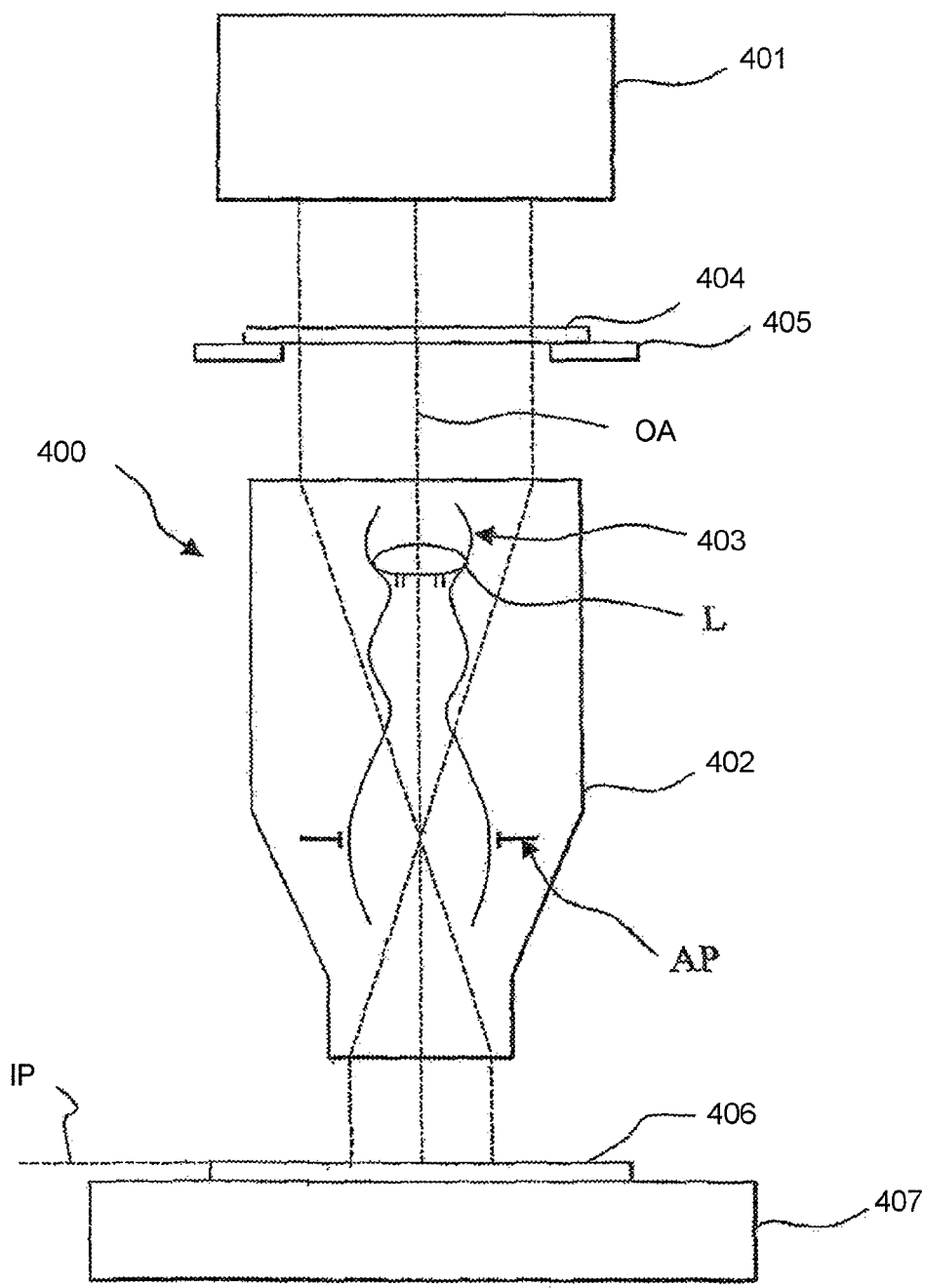
FIG. 4 shows a diagrammatic view to describe the structure in principle of a microlithographic projection exposure apparatus.

FIG. 4 shows a diagrammatic view of the structure of a microlithographic projection exposure apparatus with an illumination system.

Referring to FIG. 4 a projection exposure apparatus 400 has an illumination device 401 and a projection objective 402. The projection objective 402 includes a lens arrangement 403 with an aperture stop AP, an optical axis OA being defined by the only diagrammatically indicated lens arrangement 403. A lens L, which for example can be provided with a layer system treated in accordance with the method, is also only diagrammatically indicated.

Disposed between the illumination device 401 and the projection objective 402 is a mask 404 which is held in the beam path by means of a mask holder 405. The mask 404 has a structure in the micrometer to nanometer range, the image of which is produced by means of the projection objective 402 on an image plane IP, reduced for example by the factor of 4 or 5. A light-sensitive substrate 406 or a wafer which is positioned on a substrate holder 407 is held in the image plane IP. The minimum structures which can still be resolved depend on the wavelength λ of the light used for the illumination operation and the image-side numerical aperture of the projection objective 402, wherein the maximum resolution which can be achieved in respect of the projection exposure apparatus 400 rises with decreasing wavelength λ of the illumination device 401 and with an increasing image-side numerical aperture in respect of the projection objective 402.

Although the invention has been described by way of specific embodiments, numerous variations and alternative embodiments will be apparent to those skilled in the art, for example by combination and/or exchange of features of individual embodiments. Accordingly it will be appreciated by those skilled in the art that such variations and alternative embodiments are also embraced by the present invention, and the scope of the invention is limited only in the sense of the accompanying claims and equivalents thereof.

The invention claimed is:

1. A method of processing an optical element which has a substrate and a multi-layer system applied to said substrate, wherein the multi-layer system is an anti-reflection layer system or a protective layer system, and wherein the multi-layer system in a starting condition has a plurality of volume defects, comprising:
   at least partially filling at least one of the volume defects with a filling material; and
   providing the optical element as a lens in an illumination system or a projection objective of a microlithographic exposure apparatus.

2. A method as set forth in claim 1, wherein the filling provides a degree of filling, which is defined as the relationship of the defect volume filled with the filling material to the total defect volume, for the at least one at least partially filled volume defect, of at least 30%.

3. A method as set forth in claim 2, wherein the filling completely fills the at least one at least partially filled volume defect with the filling material.

4. A method as set forth in claim 1, wherein the filling fills at least 30% of the total defect volume present within the layer system with the filling material.

5. A method as set forth in claim 1, wherein the filling material relative to a layer material of the layer system surrounding the volume defect has a lower refractive index difference than air.

6. A method as set forth in claim 1, wherein the filling material is silicon dioxide.

7. A method as set forth in claim 1, wherein the filling material comprises an organic material.

8. A method as set forth in claim 1, wherein the at least one volume defect has a mean diameter between 5 nm and 50 nm.

9. A method as set forth in claim 1, wherein the at least one volume defect has a mean diameter of greater than 50 nm.

10. A method as set forth in claim 1, wherein the filling is effected under the action of electromagnetic radiation.

11. A method as set forth in claim 10, wherein the electromagnetic radiation has a wavelength of less than 370 nm.

12. A method as set forth in claim 10, wherein the electromagnetic radiation is radiated in locally positionally resolved fashion substantially in the region of volume defects in the layer system.

13. A method as set forth in claim 10, wherein the filling material is formed by chemical conversion of a starting material during the action of the electromagnetic radiation.

14. A method as set forth in claim 13, wherein the starting material is an organic silicon compound.

15. A method as set forth in claim 13, wherein the starting material is in gas form.

16. A method as set forth in claim 15, wherein the starting material comprises at least one of fluorotrimethylsilane, hexamethyldisilazane, trimethylsilanol and hexamethylcyclotrisiloxane.

17. A method as set forth in claim 13, wherein the starting material is liquid.

18. A method as set forth in claim 17, wherein the starting material comprises a polydimethylsiloxane.

19. A method as set forth in claim 1, wherein the filling material comprises water.

20. A method as set forth in claim 1, wherein the multi-layer system is an anti-reflection layer.

21. A method of processing an optical element which has a substrate and a multi-layer system applied to said substrate, wherein the optical element is arranged in a microlithographic projection exposure apparatus having an illumination system and a projection objective, and wherein the layer system in a starting condition has a plurality of volume defects, comprising:
- at least partially filling at least one of the volume defects with a filling material, and
- operating the microlithographic projection exposure apparatus during the filling.

22. A method as set forth in claim 21, wherein the filling comprises:
- introducing a starting material configured to be converted into the filling material into the beam path of the microlithographic projection exposure apparatus; and
- irradiating the starting material with UV laser light.

23. A method as set forth in claim 22, wherein the UV laser light for the irradiating of the starting material is provided by the illumination system.

24. A method as set forth in claim 21, wherein the projection objective is an immersion objective which is drained before the introduction of the starting material into the beam path.

25. A method of manufacturing an optical element, comprising:
- applying a layer system to a substrate, wherein the layer system, after application in a starting condition, has a plurality of volume defects;
- processing the layer system applied to the substrate, the processing comprising at least partially filling at least one of the volume defects with a filling material, wherein the substrate with the processed layer system provides the optical element having an anti-reflection layer or a protective layer; and
- providing the optical element as a lens in an illumination system or a projection objective of a microlithographic exposure apparatus.

26. An optical element manufactured according to the method as set forth in claim 25.

27. A microlithographic projection exposure apparatus comprising at least one optical element as set forth in claim 26.

28. A microlithographic projection exposure apparatus as set forth in claim 27 designed for a working wavelength of less than 250 nm.

29. A method of microlithographic manufacture of microstructured components comprising:
- providing a substrate to which a layer of a light-sensitive material is at least partially applied;
- providing a mask having structures, the image of which is to be produced;
- providing a projection exposure apparatus as set forth in claim 27; and
- projecting at least a part of the mask onto a region of the layer by means of the projection exposure apparatus.

* * * * *

UNITED STATES PATENT AND TRADEMARK OFFICE
CERTIFICATE OF CORRECTION

PATENT NO. : 8,435,726 B2  
APPLICATION NO. : 12/135781  
DATED : May 7, 2013  
INVENTOR(S) : Alexandra Pazidis et al.

Page 1 of 1

It is certified that error appears in the above-identified patent and that said Letters Patent is hereby corrected as shown below:

In the Specification

Column 4, Line 10: delete "hexamethyidisilazane," and insert -- hexamethyldisilazane, --

Column 4, Line 12: delete "hexamethyidisilazane," and insert -- hexamethyldisilazane, --

Column 6, Line 28: delete "hexamethyidisilazane)" and insert -- hexamethyldisilazane) --

Signed and Sealed this  
Twelfth Day of November, 2013

Teresa Stanek Rea  
*Deputy Director of the United States Patent and Trademark Office*